United States Patent [19]
Guruswamy et al.

[11] Patent Number: 6,071,357
[45] Date of Patent: Jun. 6, 2000

[54] MAGNETOSTRICTIVE COMPOSITES AND PROCESS FOR MANUFACTURE BY DYNAMIC COMPACTION

[76] Inventors: Sivaraman Guruswamy, 2001 S. Broadmoor St., Salt Lake City, Utah 84108; Michael K. McCarter, 1227 Gaylene Cir., Sandy, Utah 84094; Michael R. Loveless, P.O. Box 175, KKV 4002, Thailand

[21] Appl. No.: 08/938,855

[22] Filed: Sep. 26, 1997

[51] Int. Cl.⁷ .................................................... B22F 1/00
[52] U.S. Cl. ............................................ 148/301; 148/304
[58] Field of Search .................................... 148/301, 303, 148/304; 252/62, 55; 428/553, 576, 611

[56] References Cited

U.S. PATENT DOCUMENTS

| | | |
|---|---|---|
| 1,286,965 | 12/1918 | Elmen . |
| 1,292,206 | 1/1919 | Woodruff . |
| 3,156,039 | 11/1964 | Martens ..................................... 29/421 |
| 3,160,952 | 12/1964 | Corney et al. ............................. 29/529 |
| 3,215,565 | 11/1965 | Harvey .................................... 148/12.4 |
| 3,218,199 | 11/1965 | Cowan et al. ............................... 148/4 |
| 3,228,757 | 1/1966 | Verbraak .................................... 29/180 |
| 3,445,296 | 5/1969 | Hidekazu Abe et al. .............. 136/120 |
| 3,615,915 | 10/1971 | Luiten et al. ............................. 148/103 |
| 3,986,944 | 10/1976 | Gould ....................................... 204/192 |
| 4,159,909 | 7/1979 | Wilson ....................................... 75/170 |
| 4,484,995 | 11/1984 | Pirich et al. ........................ 204/192 M |
| 4,711,795 | 12/1987 | Takeuchi et al. . |
| 4,814,053 | 3/1989 | Shimokawato ...................... 204/192.15 |
| 4,889,607 | 12/1989 | Buschow ............................. 204/192.15 |
| 4,906,306 | 3/1990 | Araki et al. ......................... 148/11.5 Q |
| 4,929,320 | 5/1990 | Yamada et al. ...................... 204/192.2 |
| 4,933,025 | 6/1990 | Alson et al. ............................. 148/104 |
| 4,933,059 | 6/1990 | Sugawara et al. ................. 204/192.15 |
| 4,939,041 | 7/1990 | Kabacoff et al. ........................ 428/607 |
| 4,940,523 | 7/1990 | Takeshima ......................... 204/192.12 |
| 5,505,903 | 4/1996 | Schrey et al. ............................. 419/64 |
| 5,907,105 | 5/1999 | Pinkerton et al. . |

OTHER PUBLICATIONS

F. E. Pinkerton, et al. "Magnetostricitive Composites" General Motors Corporation, Resarch and Development Center, R&D–8605, Nov. 13, 1996.

K. B. Hathaway, et al. "Magnetostrictvie Materials" MRS Bulletin, vol. XVIII, No. 4, Apr. 1993.

Guruswamy, et al. "Explosive Compaction of Metal–Matix Composites and Deuterides" Advance in Power Metallurgy, Vo. 6, Metal Powder Industies Federation, Leander, et al. Eds., (1991) (no month).

Herbst, et al. "Estimating the Effective Magnetostrictiion of a Composite: A simple Model"General Motors Corporation, Research and Development Center, R&D–8608, Nov. 25, 1996.

C. Rogers, "Intellignet Materials" Scientific American, Sep. 1995.

*Primary Examiner*—John J. Zimmerman
*Assistant Examiner*—Jason Savage
*Attorney, Agent, or Firm*—James L. Sonntag

[57] ABSTRACT

A metal-matrix composite of magnetostrictive powder is manufactured by dynamic compaction, such as that provided by the shock waves of an explosive, from a magnetostrictive powder in the presence of a matrix-forming metal. Under the conditions of dynamic compaction, property compromising phases between the powder and the binding metal are not formed, resulting in a composite essentially free of these phases. The composites may be formed by coating a magnetostrictive powder with a matrix-forming metal by a sputtering process and dynamically compacting the coated powder. A coated powder may also be made by sputtering a layered composite of metal-magnetostrictive material-metal, and grinding the layered composite. Metal-matrix composites may also be made by mixing the matrix-forming metal with a magnetostrictive powder and dynamically compressing the mixture. Metal-matrix composites of amorphous magnetostrictive powders may be annealed in the presence of a magnetic field.

7 Claims, 7 Drawing Sheets

MAGNETOSTRICTIVE COMPOSITES AND PROCESS FOR MANUFACTURE BY DYNAMIC COMPACTION

RELATED APPLICATIONS (Not applicable)

STATEMENT REGARDING FEDERALLY SPONSORED RESEARCH OR DEVELOPMENT (Not applicable)

FIELD OF THE INVENTION

This invention relates to magnetostrictive materials, in particular composites of magnetostrictive powders.

BACKGROUND OF THE INVENTION

Magnetostrictive alloys change in dimension in response to an applied magnetic field, and have been used in sonar transducers, actuators, vibration control and sensors. Of particular interest are alloys of iron and rare earth elements that have large magnetostriction constants. Examples of such materials are disclosed in U.S. Pat. No. 4,308,474 to Savage et al., which is hereby incorporated by reference. These include alloys of iron, usually with terbium (Tb) and dysprosium (Dy). The alloys that have to date shown the best magnetostrictive properties are known as "Terfenol-D" and have the general formula $Tb_xDy_{1-x}Fe_{2-w}$, where $0.20 \leq x \leq 1.00$ and $0 \leq w \leq 0.20$.

Terfenol-D and other similar alloys, because of their high magnetostriction constants, are of particular interest for use in micro-mechanical systems, such as sensors and actuators. Shapes, such as rods, can be made by melting or casting to form a polycrystalline product. A problem with these shapes is that they are particularly brittle, which severely limits their applicability. Furthermore, the pure magnetostrictive Terfenol-D like alloys are difficult or impossible to machine, which precludes shapes that cannot be cast or molded.

In order to increase the toughness of shapes of Terfenol-D and like magnetostrictive materials, it has been proposed to form a composite of the magnetostrictive material in a binding matrix of another material. For example, Terfenol-D alloys with a slightly raised rare earth (where w is greater than about 0.1) can be hot-pressed into a composite of a ductile Dy-Tb solid solution between a brittle $Tb_xDy_{1-x}Fe_2$ phase. Dy and Tb have high tensile ductilities, up to 20%. While there is an improvement in toughness, the improvement is only modest and far below what might be expected based upon the high ductility of the rare earth phase. The problem is in the microstructure of the phase binding the $Tb_xDy_{1-x}Fe_2$ particles together. The heat required in the formation of the shape results in formation of a proeutectic phase of the rare earth metals, Re, and iron ($ReFe_2$) and a eutectic phase of Dy and $ReFe_2$. The presence of these phases counter the ductility of the metal phase, compromising the toughness of the product.

Composites of Terfenol-D and other magnetostrictive materials have been formed with a matrix of a binder metal, such as aluminum, nickel, or iron. These have been made by hot pressing or sintering powdered magnetostrictive materials with an appropriate metal or metal-alloy powder. However, the problem with these composites is similar to that discussed above, i.e., phases form between the Terfenol-D powder particles and the binder material at the conditions of formation. These phases lend brittleness to the composites, resulting in brittle Terfenol-D/metal binder composites with inadequate toughness for many applications. In addition, the amount of magnetostrictive material is reduced because of reaction with the binder material, thus reducing the magnetostriction constant of the composite. In summary, those methods for forming magnetostrictive particle/metal binder composites by hot pressing or sintering result in undesirable phase or phases that compromise the physical properties of the shape.

Composites have also been made of magnetostrictive materials, such as Terfenol-D, in a matrix of a polymeric resin binder material. The composites have good toughness properties. However, a problem with polymer matrix composites is that the stiffness is significantly lower, which limits their frequency response.

A long felt need in the art is method for forming magnetostrictive shapes that have the toughness, and machinability of resin matrix composites with higher strength.

OBJECTS OF THE INVENTION

It is, therefore, an object of the invention to provide a composite of a magnetostrictive material in a metallic binder matrix that does not have the inherent problems of prior-art metal matrix composites where undesirable phases are formed in the binding phase.

It is another object of the invention to provide a composite of a magnetostrictive material and a metal matrix that is essentially free of phases that form between the magnetostriction material and the binding or matrix metal.

It is another object of the invention to provide a composite of a magnetostrictive material with a matrix of a ductile metallic phase.

It is another object of the invention to provide a magnetostrictive material composite with toughness comparable or superior to polymer binder systems, and with the stiffness properties of metal-matrix composites.

It is another object of the invention to provide a method for manufacturing a metal matrix magnetostrictive material without the formation of undesired phases in the binding phase.

In is another object of the invention to provide a method for manufacturing a composite of the magnetostrictive material that can be easily machined.

It is another object of the invention to make a composite of amorphous Terfenol-D powders bonded by a ductile metal phase, without crystallizing the amorphous phase, followed by annealing of the compact to obtain the desired [111] textured crystalline bulk shape.

Further objects of the invention will become evident in the description below.

BRIEF SUMMARY OF THE INVENTION

The present invention involves metallic binder composites of magnetostrictive powder that is essentially free of property compromising phases in the microstructure. Unlike sintered and hot-pressed metallic matrix composites of the prior art where mixed and reacted phases exist at the boundary of the powder particle and the metallic binding material, the present invention is manufactured in a way such that these phases cannot form.

In a preferred method of the invention, a magnetostrictive material is coated with a binder-metal or matrix-forming metal, by a method such as sputtering. Coated particles are then placed in the mold and subjected to dynamic compaction from a high power shock wave passing through the powder, such as from an explosive charge. The shock wave creates stresses that greatly exceed the flow stress of the binding metal. Under the shock wave, the binding metal flows between the powder particles and into void places forming a binding metal matrix around the particles. Since the shock wave is of very short duration, the heating of the surface from the compaction is of a very short duration and is quickly dissipated, thus avoiding the high-heat conditions and the time required to react and form mixed phases between the metal matrix and powder particle. The result is a metal/powder interface that is essentially free of these phases. The composite is accordingly much tougher than prior-art metal-matrix composites.

In an alternate embodiment of the invention, magnetostrictive powders are mixed with a powder of a matrix-forming metal, and the mixed powders are dynamically compacted as described above. Under the shock wave, the metal powder flows between the magnetostrictive particles to form a metal matrix surrounding the magnetostrictive particles. This embodiment is less preferred because a higher metal content is generally required than that required for metal coated magnetostrictive particles.

By practice of the invention, it is possible to manufacture composites with toughness comparable or exceeding resin matrix composites, while maintaining superior magnetostrictive properties.

The invention also involves the manufacture of a composite of -amorphous Terfenol-D powders bonded by a ductile metal phase, without crystallizing the amorphous phase, followed by annealing of the compact to obtain the desired [111] textured crystalline bulk shape.

DETAILED DESCRIPTION OF THE INVENTION

Figure 1A:
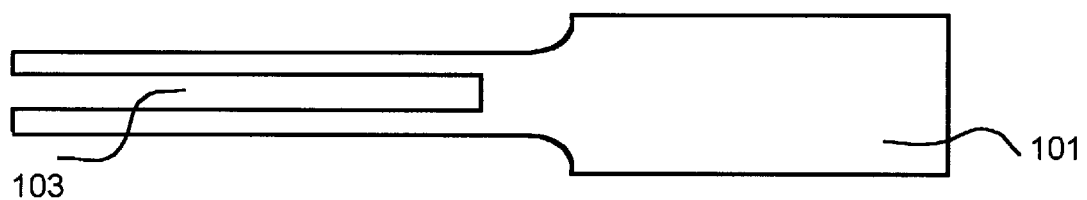
FIGS. 1A and 1B are each a schematic diagram of a mold used in the process of the invention.

The powders for the present invention are fine powders of a magnetostrictive material, preferably coated with a metal. Powders for coating or mixing with the metal can be prepared by any suitable process for producing metal alloy powders, e.g., vapor reaction processes, film deposition by magnetron sputtering, and the like. The powder may also be made by melting together appropriate amounts of constituent metals and then grinding the alloy. A film deposition process may be used to form a thin film of the material, which is then easily ground. The powders may be crystalline, or amorphous.

The composition of the powders comprises one or more magnetostrictive materials. Suitable magnetostrictive materials include those with high magnetostrictive properties. Suitable materials include, but are not limited to certain of the magnetostrictive rare earth alloys, particularly of Sm, Ho, Tb and Dy, and alloys of transition metals, particularly Fe, with rare-earth elements (lanthanides). Examples include $TbF_2$, $FeHo$, $SmFe_2$, and those disclosed in U.S. Pat. No. 4,308,474 to Savage et al., including Terfenol, an alloy of Tb and Fe, and Terfenol-D, an alloy of Tb, and alloys of iron, and various other rare earth-iron alloys. Preferred materials include those where the absolute value of the saturation magnetostriction ($\lambda$) is greater than about $10^{-4}$, such as $DyFe_2$, and $ErFe_2$. Most preferred materials are those where the absolute value of the saturation magnetostriction is greater than about $10^{-3}$, such as Terfenol, Terfenol-D and $SmFe_2$. Terfenol and Terfenol-D alloys can be described by the formula $Tb_xDy_{1-x}Fe_{2-w}$, where $0.20 \leq x \leq 1.00$ and $0 \leq w \leq 0.20$. A list of such suitable materials is shown below in Table I.

TABLE I

Saturation Magnetostriction of Randomly Oriented Polycrystals

| Material | Saturation Magnetostriction $\lambda \times 10^{-6}$ |
|---|---|
| DyZn(001) at 4.2K | 5300 |
| Terfenol (TbFe$_2$) | 1750 |
| Terfenol-D (Tb$_{0.3}$Dy$_{0.7}$Fe$_2$) | 1100 |
| SmFe$_2$ | −1560 |
| DyFe$_2$ | 433 |
| ErFe$_2$ | −300 |

The particles of the powder are generally small enough to form the composites and large enough to prevent excessive surface oxidation. Powder materials between 32 μm and 180 μm have been found suitable.

The powders are coated with a suitable ductile and elastically stiff metal or metal alloy by any suitable process. Magnetron sputtering has been found to be suitable. Suitable metals include, but are not limited to, copper, iron, noble metals (such as silver, gold, platinum, palladium), nickel, and alloys of one or more of these metals. The matrix metal should also impart suitable stiffness and toughness to the composite, so that very soft metals, such as lead, are not preferred. If the powder is formed by a film deposition, a layer of the binding metal may be deposited upon the film before it is ground. Any process that can produce a fine magnetostrictive powder coated with a suitable binding metal is contemplated in the present invention.

Metals that are very reactive or form oxide phases, such as aluminum are generally not suitable. A requirement is the metal coating be chemically stable, i.e., does not form oxides or other compounds, or alloy or otherwise react with the powder particle during or after the coating process to form phases that would significantly interfere with the function of the matrix metal as a binding phase or compromise the toughness of the composite.

The amount of metal coated upon the powder particles is sufficient for the metal to bind the particles upon dynamic compaction of the particles. For Terfenol-D, powders with a sputtered coating between 1 μm and 5μm copper has been found suitable. Basically, the requirement is that there be sufficient metal between the particles upon compaction to form the metal matrix. Preferably most of the particle surfaces are coated, at or near 100%.

The metal coated powder is subjected to dynamic compaction. Dynamic compaction is characterized as momentary application of an extremely high pressure. This is contrasted with the compression characteristic of press-sintered and hot-press methods used in the prior-art, which are conducted at a much lower pressure and are carried out over an extended period of time. Dynamic compaction is best achieved by shock waves produced by, for example, contact with a shaped explosive charge, or by impact with a high-velocity projectile. The shock waves moving through the powder create pressures that are several times the flow stress of the binding metallic phase, typically several GPa (usually about 2 to 7 GPa.). Consolidation occurs by deformation of the metal coating and extrusion into void spaces between the particles. The material at or near the surface of the particle, which includes the metal-matrix binding material and the surface of the magnetostrictive material particle undergoes temperature pulses that range from microseconds to milliseconds, but these are quickly quenched by heat flow into the bulk of the powder particle. Since the heating is extremely short, it cannot sup port chemical reaction, melting, or other phase formation processes. Thus, it is possible to essentially preserve the original microstructure of the metal/magnetostrictive material interface, with little or no chemical reaction or alloying of those two phases. Thus, the formation of undesirable phases that can compromise the physical properties of the final compacted shape is avoided.

Basically any compaction process is deemed dynamic compaction for purposes of the present invention if it achieves the bonding of the metal coated particles with an absence of any significant alloying or chemical reaction of the binding metal and/or the magnetostrictive powder particle using a very high momentary pressure. The pressure required varies for the powder and the metal coating. If the pressure is to low, pressure and temperature will be of longer duration and undesirable phases will form.

The preferred method of dynamic compaction is by placing the sample to be compacted into a shaped explosive charge, detonating the explosive and retrieving the compacted sample. Methods of explosive compaction of powder composites are known and can be readily adapted to present invention. Such a methods are disclosed, for example, in Guruswamy, et al. "Explosive Compaction of Metal-Matrix Composites and Deuterides" *Advances in Powder Metallurgy*, vol. 6, (Metal Powder Industries Federation, 1991) Leander & Reynolds Company, Eds. (1991), and Guruswamy et al., "Explosive Compaction of Magnequench Nd—Fe—B Magnetic Powders" J. Appl. Phys. 79 (8), Apr. 15, 1996, p. 4851.

In an alternate embodiment of the invention, the magnetostrictive particles are not coated, but instead mixed with a powder of the matrix metal. The mixed powders are subjected to dynamic compaction. The metal powder flow under the shock wave between the magnetostrictive powder particles, forming the metal matrix. Sufficient metal powder is provided to form an essentially continuous metal matrix throughout the dynamically compacted composite. The amounts of powder used in the examples below has been found suitable.

Example of Manufacturing Terfenol-D Composites
Powder Preparatioin

Two different types of Terfenol-D powders were used in explosive compaction experiments; amorphous and crystalline. Both powders had a nominal formula of about $Tb_{0.3}Dy_{0.7}Fe_{2.0}$.

Amorphous Powder

Amorphous powders of Terfenol-D were fabricated by magnetron sputtering. Large glass substrates were used to collect as much film as possible. Four separate deposition operations were required to collect a sufficient amount of material for compaction. The substrates were wiped with a thin layer of vacuum grease to allow easy removal of the film after deposition. First, a layer of copper was sputtered for 10 minutes at 50 Watts DC, and $4.0 \times 10^{-4}$ Torr. Terfenol-D was then sputtered for 1.5 to 12 hours at 80 Watts DC and $4.0 \times 10^{-4}$ Torr. Terfenol-D was available from Etrema Products, Inc. Ames, Iowa. Finally, another copper layer was sputtered upon the Terfenol-D layer under conditions similar to the first. Films were scraped off the glass with a razor and cleaned in trichloroethylene and then in acetone. A ceramic mortar and pestle set was used to grind the film flakes into powder. The total amount of material produced was 3.425 g. The compact produced from this powder will be referred to as compact #1.

Crystalline Powder

Crystalline powders were produced by grinding Terfenol-D powder with a ceramic mortar and pestle set. The powder was available from Etrema Product, Inc. Ames, Iowa. Five compacts were made from crystalline powders. These will be referred to as compact #2 through #6. The powder for compact #2 was not classified by size during the grinding process while the rest were classified.

The procedure for the preparation for the powder for compact #2 began with grinding. Next, the powder was given six cycles of the following treatment. The powder was spread out in a thin layer and copper was sputtered onto the surface of the particles for 10 minutes at 80 Watts DC. The powder was then mixed up and spread again. After this treatment, the powder was classified with a 180 μm square mesh screen. 55.7% by mass passed through the screen. Copper powder was 10 mass %.

Powder for Compact #3 through #6 was recycled through a 180 μm screen during grinding. The oversize particles were ground until all material was smaller than 180 μm.

Powder for Compact #3 was given eight cycles of copper sputter coating for 20 minutes each. Then the powder was screened at 32 μm to remove the fine particles Powder for Compact #4 was of −180 μm and +32 μm Terfenol-D particles with no coating. This sample was intended to be a basis for comparison for composite compacts.

Powder for Compact #5 was of −180 μm and +32 μm Terfenol-D particles with 10 vol. % of 2 to 3 μm copper powder mixed in before compaction.

Powder for Compact #6 was of −180 μm and +32 μm Terfenol-D particles with 10 vol. % of 6 to 10 μm iron powder mixed in before compaction.

Amorphous powder for Compact #1 required further grinding after it was scraped from the substrate. Both sides of the flakes were completely covered with copper. The edges of flakes were not coated with copper. Optical microscopy of the copper-coated crystalline powders revealed that complete encapsulation was achieved. In randomly selected small samples, all particle surfaces were observed to be coated with copper.

Explosive Compaction

Figure 1B:
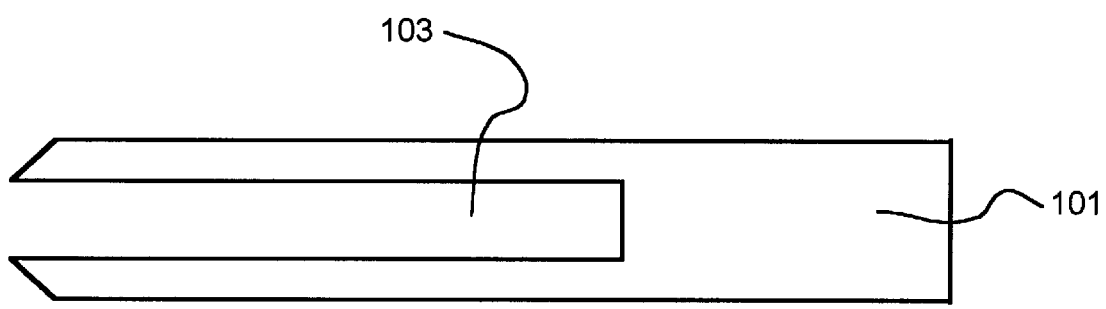

After the powders were prepared, they were packed into tubular copper molds by repeatedly adding a small amount of powder tamping with a steel rod. The steel cap was then pushed into the mold and crimped in place. Two different mold geometries were used, as shown in FIGS. 1A and 1B. In each figure is shown a copper mold 101 with a cavity 103 for the powder. FIGS. 1A and 1B are approximately to scale. For FIG. 1A the length of the mold, length of the cavity and diameter of the cavity are 64.5 mm, 38.1 mm, and 5.5 mm, respectively. For FIG. 1B, the respective dimensions are 64.5 mm, 39.8 mm and 7.96 mm.

Figure 2:
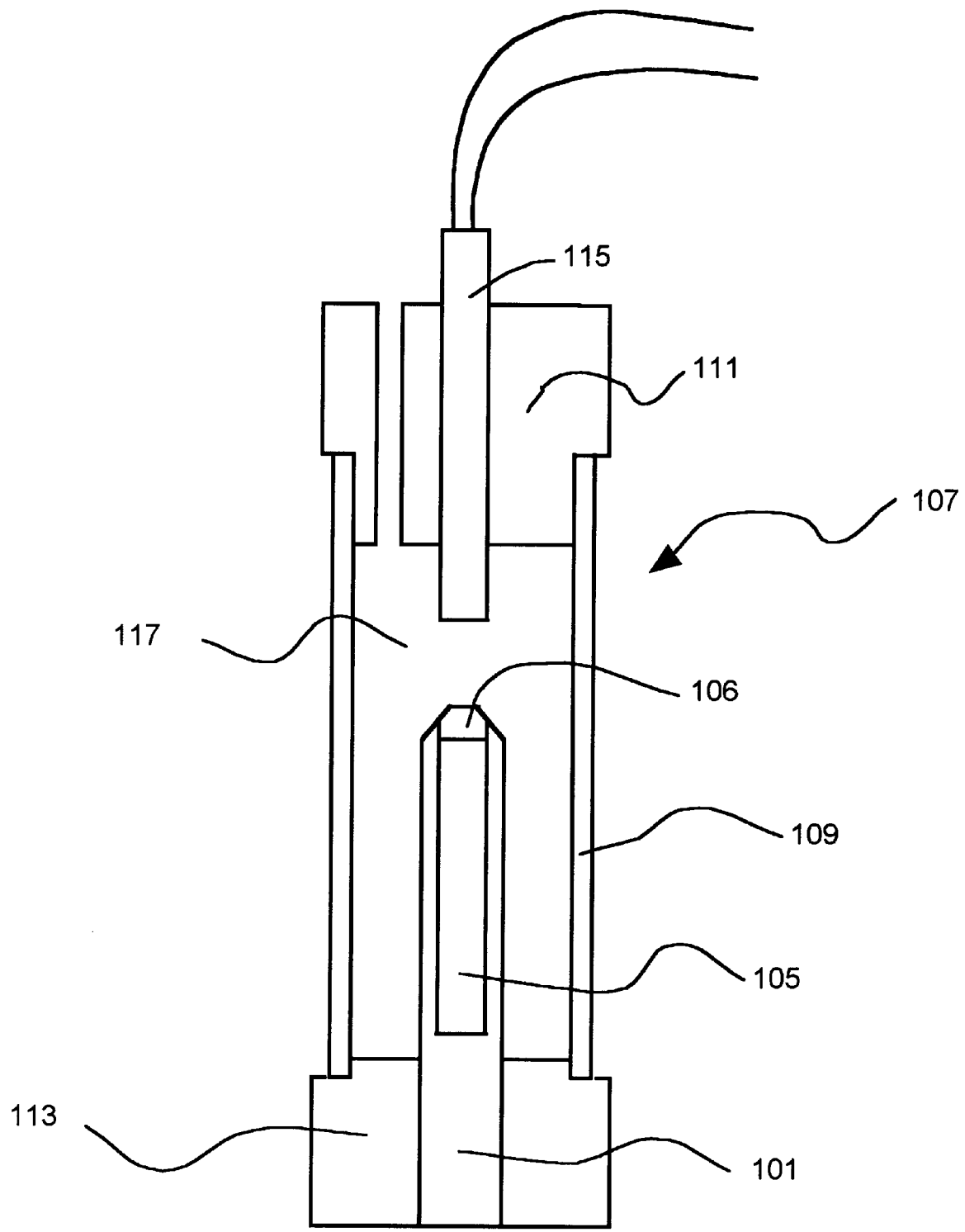
FIG. 2 is a schematic diagram of an assembly of a mold and in explosive charge just before explosive compaction.

Reference is now made to FIG. 2. The copper tube mold 101 containing the powder 105, and closed by steel cap 106 was placed centrally in an explosive charge container 107. The container 107 comprised a PVC tube 109 with upper and lower end caps 111, 113. A cylindrical detonator fuse 115 was inserted in the snugly fitting hole in the upper end cap 111 of the PVC container 107. A liquid-slurry explosive Dyno Noble 207X was prepared by mixing the two components, perchlorate-base liquid component A and a aluminum-based component B. The mixture was then poured into the main cavity 117 of the container 107, which was closed with the lower end cap, to which was fitted the assembly containing the copper tube containing the powder to be compacted. The weight of the explosive charge used for the compaction was about 25 to 35 grams.

The explosive was detonated inside a blast chamber and the compact was recovered.

The explosive compaction was effective in consolidating powders into compacts. In most cases, the steel cap was ejected but sample powders remained in the mold.

Figure 3A:
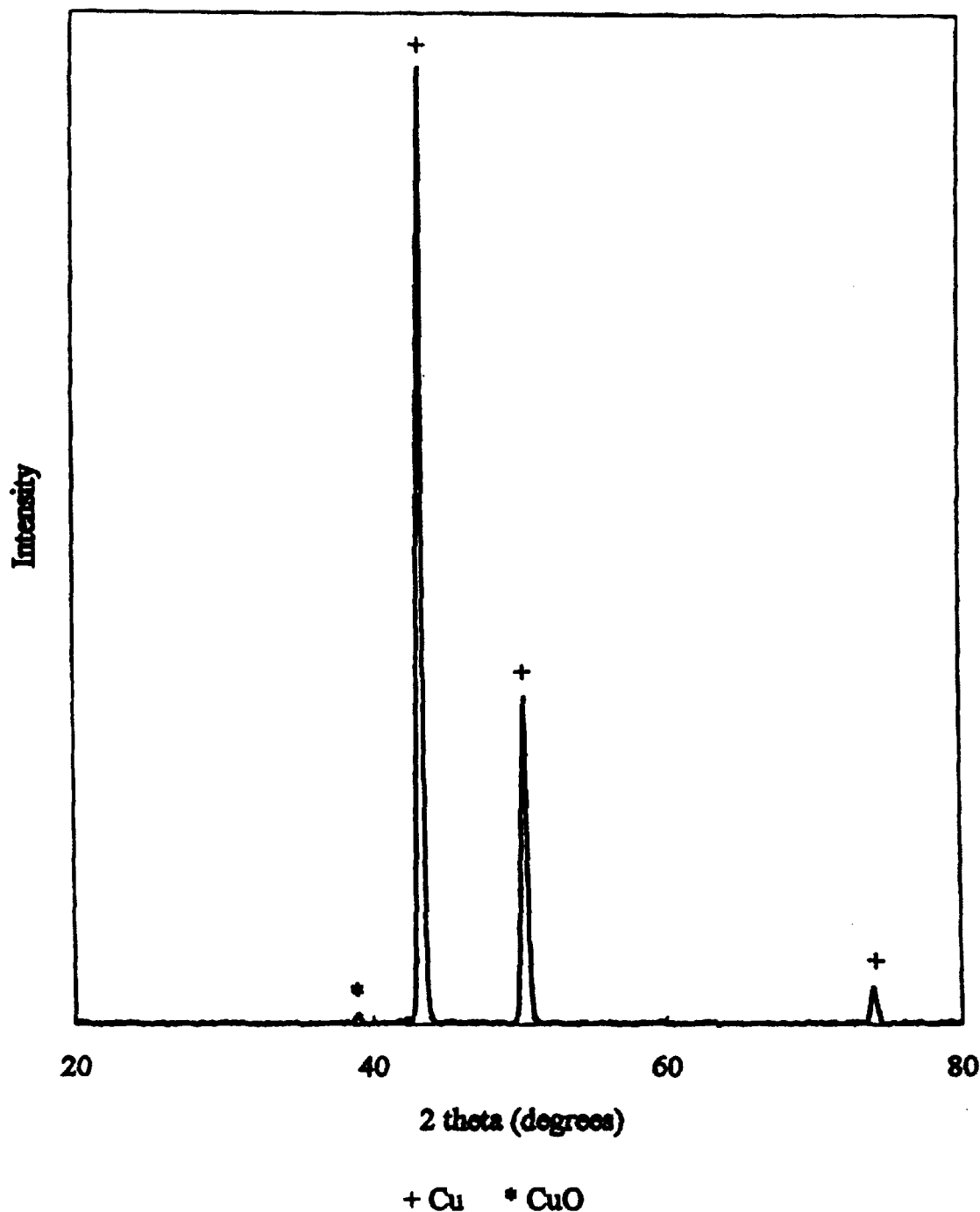
FIGS. 3A and 3B are each an x-ray diffraction diagram of a composite of the invention.

After recovery, the compacts were tested with x-ray diffraction. FIG. 3A is the x-ray diffraction pattern of compact #1 taken from a section perpendicular to the mold axis. The crystalline phases identified are Cu and CuO. The spectrum contains strong Cu peaks from the mold and a low intensity peak that possibly comes from CuO. The powder is still amorphous after compaction.

Figure 3B:
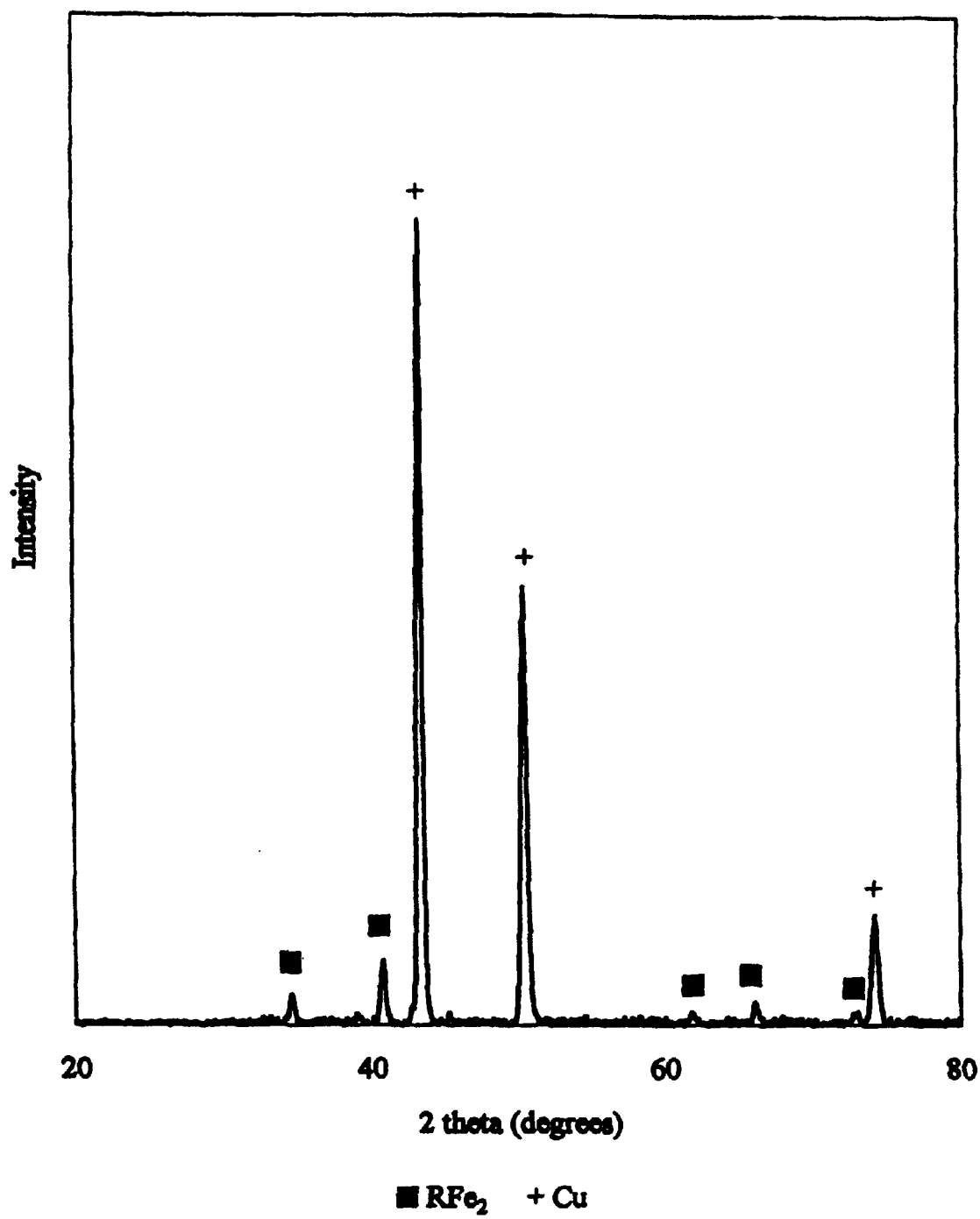

FIG. 3B is the x-ray diffraction pattern of compact #2 taken from a section perpendicular to the mold axis. Peaks from Cu and from $RFe_2$ (R=rare earth Tb, Dy) were observed. The crystalline nature of the powder was not changed by explosive compaction. In both diffraction patterns, there is no evidence of any significant amounts of mixed phases, alloys or reaction products of the Terfenol-D and the copper.

Scanning Electron Microscopy

The structure of the explosive compacts was examined by scanning electron microscopy. Both backscattered and secondary electron images were collected from polished sections perpendicular to the mold axis.

For all compacts, either a central hole or central cracks were observed on the sections examined. These were a result of the explosive compaction process. The central hole, also known as the Mach stem, was caused by melting and ejection of material subjected to focused shock waves along the compact axis. Cracks were a result of the tensile component of the reflected shock waves. The outer regions, near the mold wall, were found to be well consolidated. Intimate contact between particles was achieved.

SEM images of the compacts were taken at various magnifications. Compact 1 showed the highest degree of porosity. Flat film surfaces did not have the same degree of mechanical interlocking as did irregular shaped particles. Because of the shape of the film particles used for compact 1, the flakes were oriented during the compaction process. Flakes tended to align parallel to the mold wall in the regions near the mold wall.

Figure 4A:
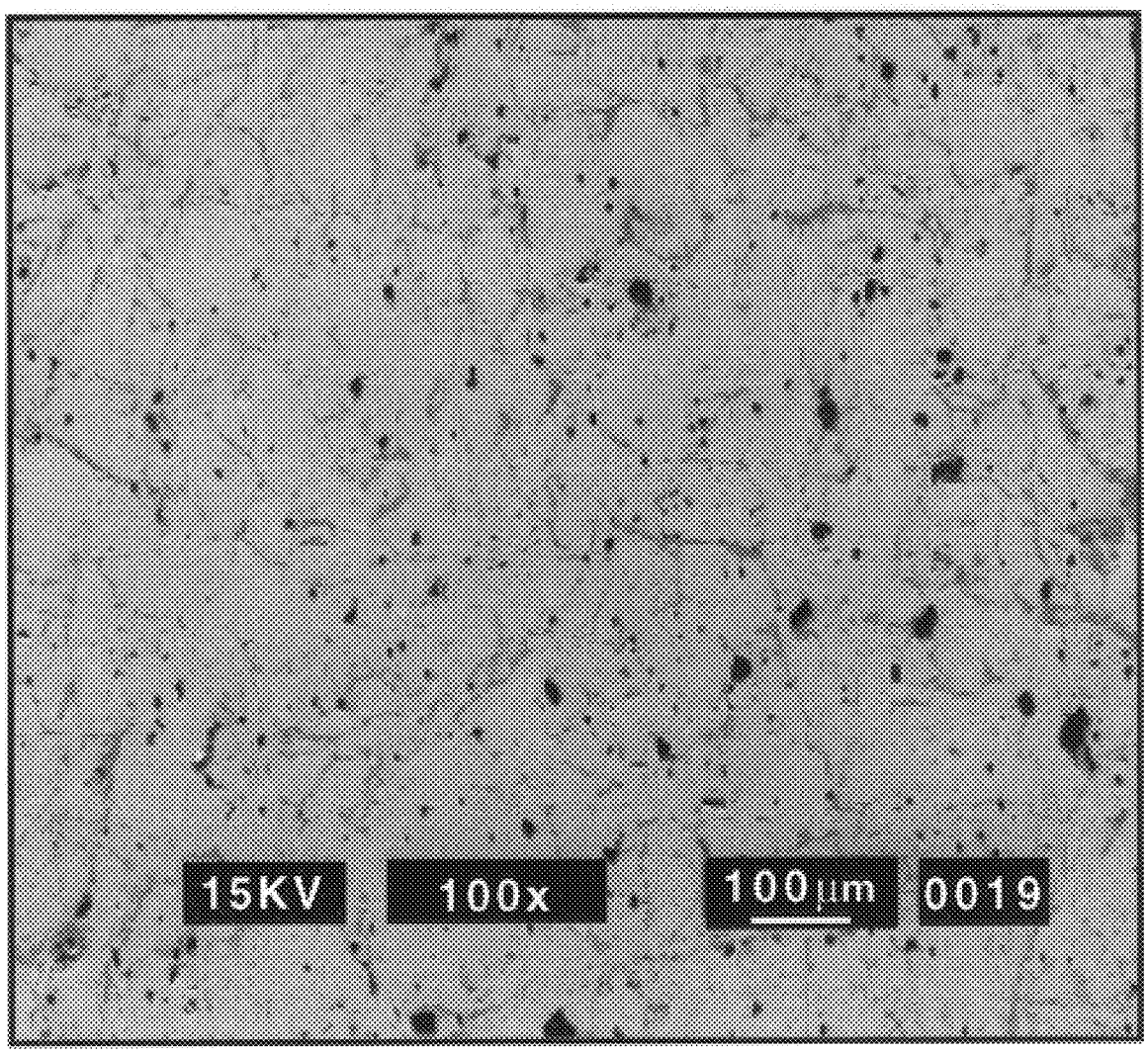
FIGS. 4A, 4B and 4C are each photomicrographs of a composite made according to the invention.
Figure 4B:
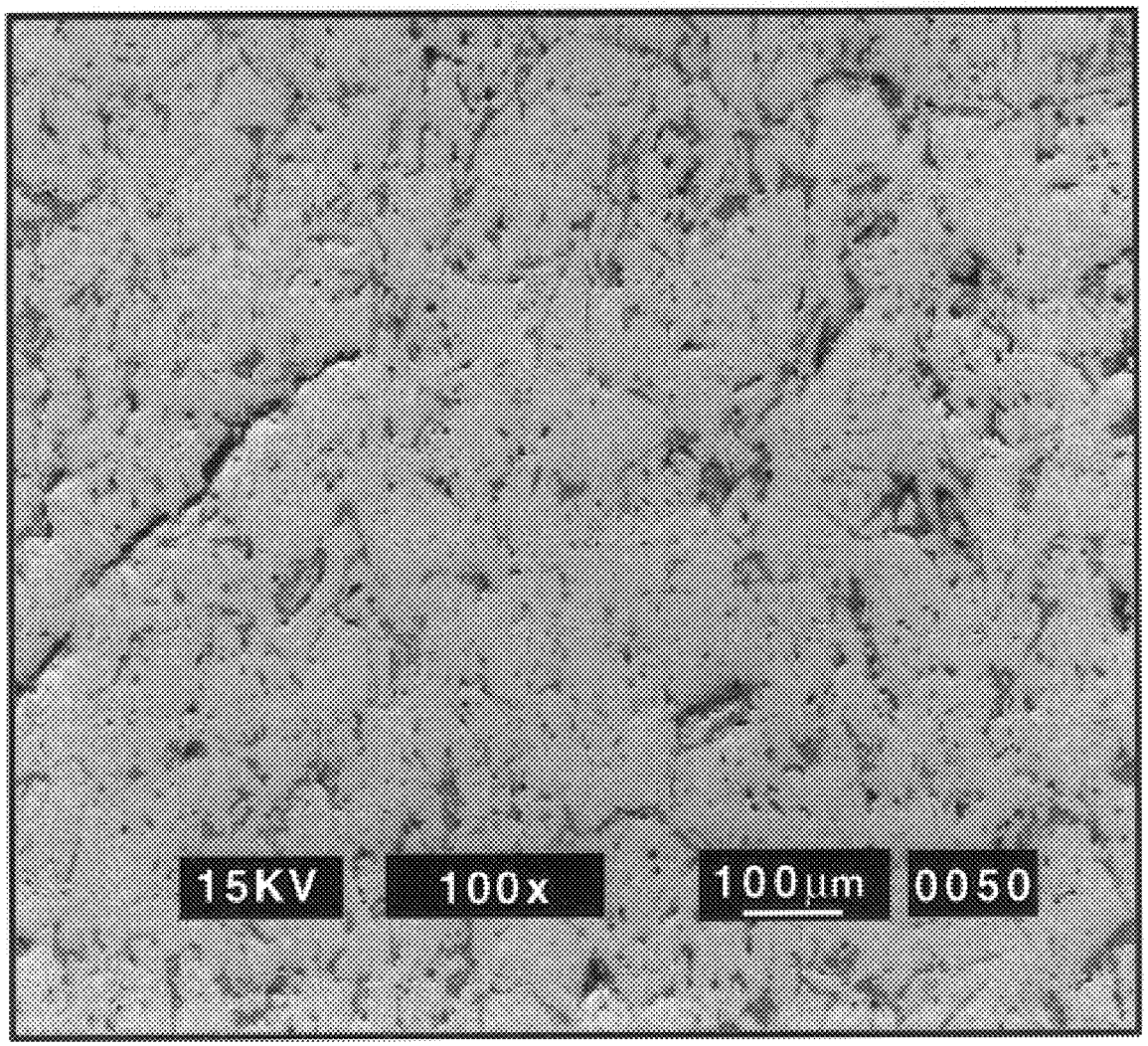
Figure 4C:
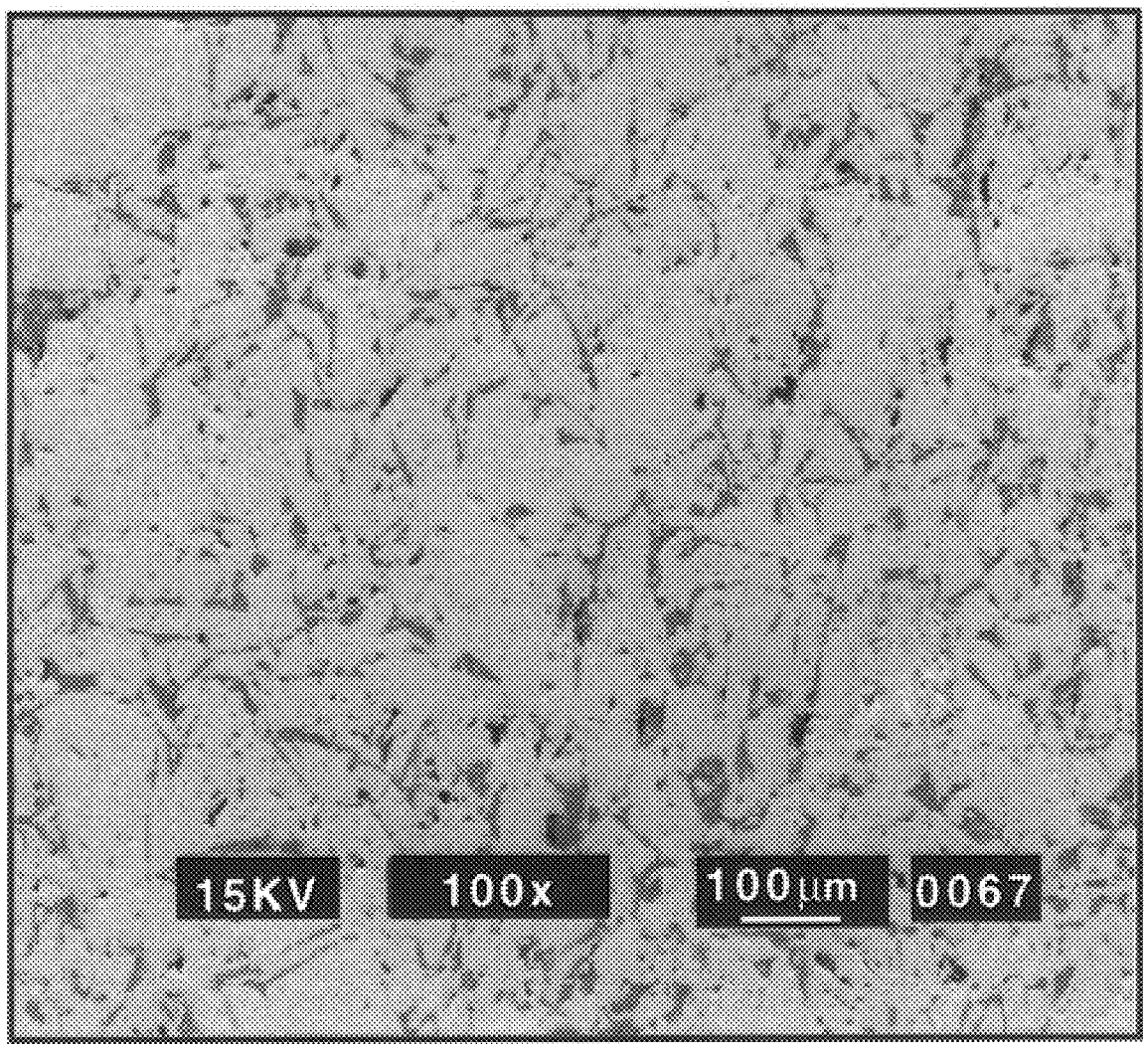

Observation of SEM images of the metal matrix compacts 1, 2, 3, 5, and 6, showed no phases other than that of the Terfenol-D particles and the copper or iron matrix metal. For example, FIGS. 4A, 4B, and 4C show an SEM images of compact 3, 5, and 6, respectively. The magnification was 100X. The copper film appeared as a continuous particle boundary phase ranging up to 5 $\mu$m in thickness. There are no observable phases other than the lighter Terfenol-D phase and the darker copper phase.

Magnetic Property Measurement

Magnetic properties of explosive compacts were measured using a Walker Scientific MM50 Hysteresigraph. Saturation magnetization, remnant magnetization, and coercivity were measured. Some samples were measured with the Cu mold still in place around the cylindrical sample. Since Cu is paramagnetic, it was not expected to affect the measurements, but it could introduce errors in the calculations of volume and mass specific properties because it was necessary to estimate the actual sample size for these samples.

Magnetic properties $H_c$, $M_r$/volume, and $M_s$/volume were measured for compacts 3, 4, 5, and 6. For compacts 1 and 2, magnetic property measurements were made on samples with the copper mold still in place so accurate measurements of sample mass specific properties because it was necessary to estimate the actual sample size for these samples.

Magnetic properties $H_c$, $M_r$/volume, and $M_s$/volume were measured for compacts 3, 4, 5, and 6. For compacts 1 and 2, magnetic property measurements were made on samples with the copper mold still in place so accurate measurements of sample mass could not be made. For these samples, the volume was estimated and values of $M_r$/volume and $M_s$/volume were calculated. The central hole was neglected in these calculations. Table II contains the magnetic properties of all compacts. $M_s$/volume of compact 1 was similar to the value measured on film 5 in the as-deposited state. $M_s$/volume for the rest of the compacts was much larger than was measured on crystalline films. Compact 6 had the largest $M_s$/volume. This was expected because of the iron present in that compact. Pure iron has a $M_s$/volume of 1714 emu/cm$^3$. Compact 4, which contained only Terfenol-D, had a $M_s$/volume of 378 emu/cm$^3$. All compacts that contained copper had a lower value than this due to the diamagnetic nature of copper. The copper present had a negligible saturation magnetization compared to the ferromagnetic Terfenol-D. This caused $M_s$/volume of the mixture of copper and Terfenol-D to be lower than for Terfenol-D alone. Compact 4 had the largest $H_c$. The addition of copper or iron caused $H_c$ to be lower. Compact 6 achieved the lowest value of $M_r/M_s$. This value was 0.597. The iron powder that was added to this compact increased $M_s$/volume without causing increased hysteresis.

TABLE II

Magnetic Properties of Explosive Compacts

| Sample | $H_c$ (Oe) | $M_r$/volume (emu/cm$^3$) | $M_s$/volume (emu/cm$^3$) | $M_r/M_s$ |
|---|---|---|---|---|
| Compact 1 | 700 | 54 | 62 | 0.872 |
| Compact 2 | 900 | 229 | 350 | 0.655 |
| Compact 3 | 1550 | 271 | 356 | 0.761 |
| Compact 4 | 1780 | 300 | 378 | 0.795 |
| Compact 5 | 1090 | 224 | 326 | 0.685 |
| Compact 6 | 920 | 285 | 477 | 0.597 |

Summary of Examples

Composites of Terfenol-D with metal binders can be produced by explosive compaction. Composites are more durable than explosive compacts of Terfenol-D alone. Adding the second metal in the form of a film repeatedly sputtered onto Terfenol-D particles results in complete encapsulation of the particles by the film. Compacts produced from powders prepared this way have a continuous particle boundary soft phase. Adding the second metal as a powder produces a well dispersed but not continuous soft phase. Intimate contact and bonding between particles are achieved. The second phase reduces $H_c$. $M_s$/volume follows the expected trend based on the separate $M_s$/volume values of the constituents added.

Annealing

Compact #1, which was a composite of amorphous Terfenol-D film and a copper metal matrix may be annealed to form a crystalline Terfenol-D phase. After annealing in the presence of a magnetic field, the resulting domain structure will have its moments along <111> easy axes in the direction of the annealing field. The optimum temperature for the formation of crystalline Terfenol-D phase is 575–600° C. 550° C. is too low and 650° C. is too high. The annealing is carried out is a atmosphere of ultra-pure argon and zirconium chips were placed in the annealing chamber to prevent oxidation.

While this invention has been described with reference to certain specific embodiments and examples, it will be recognized by those skilled in the art that many variations are possible without departing from the scope and spirit of this invention, and that the invention, as described by the claims, is intended to cover all changes and modifications of the invention which do not depart from the spirit of the invention.

What is claimed is:

1. A composite with magnetostrictive properties comprising a bulk shape comprising a magnetostrictive alloy powder of a transition metal and a rare-earth metal bound by a metallic binder matrix essentially free of reacted and mixed phases of the powder and matrix material.

2. The composite of claim 1 wherein the magnetostrictive alloy powder comprises an alloy of iron and a rare earth metal.

3. The composite of claim 1 wherein the magnetostrictive alloy powder comprises an alloy comprising iron and terbium.

4. The composite of claim 1 wherein the magnetostrictive alloy powder is an alloy consisting essentially of iron, terbium, and dysprosium.

5. The composite of claim 1 wherein the magnetostrictive alloy is selected from the group consisting of FeHo, $ErFe_2$, $DyFe_2$, $SmFe_2$, and $Tb_xDy_{1-x}Fe_{2-w}$, where $0.20 \leq x \leq 1.00$ and $0 \leq w \leq 0.20$.

6. The composite of claim 1 wherein the magnetostrictive powder is amorphous.

7. The composite of claim 1 wherein the magnetostrictive powder is crystalline.

* * * * *